(12) United States Patent
Sugiura et al.

(10) Patent No.: US 7,626,211 B2
(45) Date of Patent: Dec. 1, 2009

(54) LED REFLECTING PLATE AND LED DEVICE

(75) Inventors: Ryouji Sugiura, Ibaraki (JP); Hideki Yoshida, Ibaraki (JP)

(73) Assignee: Hitachi AIC Inc., Tokyo (JP)

( * ) Notice: Subject to any disclaimer, the term of this patent is extended or adjusted under 35 U.S.C. 154(b) by 450 days.

(21) Appl. No.: 10/574,160

(22) PCT Filed: Sep. 7, 2005

(86) PCT No.: PCT/JP2005/016407

§ 371 (c)(1),
(2), (4) Date: Mar. 28, 2006

(87) PCT Pub. No.: WO2006/030671

PCT Pub. Date: Mar. 23, 2006

(65) Prior Publication Data

US 2007/0063209 A1 Mar. 22, 2007

(30) Foreign Application Priority Data

Sep. 16, 2004 (JP) ............................. 2004-269513

(51) Int. Cl.
*H01L 33/00* (2006.01)
(52) U.S. Cl. ............................. 257/99; 257/98; 257/100
(58) Field of Classification Search ............ 257/98–100
See application file for complete search history.

(56) References Cited

U.S. PATENT DOCUMENTS 6,730,933 B1 * 5/2004 Shimizu et al. ............... 257/79

| | | |
|---|---|---|
| 2002/0084462 A1 | 7/2002 | Tamai et al. |
| 2003/0155624 A1 | 8/2003 | Arndt et al. |
| 2006/0018120 A1 * | 1/2006 | Linehan et al. ............. 362/247 |

FOREIGN PATENT DOCUMENTS

| | | |
|---|---|---|
| JP | 55-172982 | 12/1980 |
| JP | 57-128160 | 8/1982 |
| JP | 07-235696 A | 9/1995 |
| JP | 8-125227 | 5/1996 |
| JP | 11-163411 A | 6/1999 |
| JP | 11-284233 | 10/1999 |
| JP | 2000-058924 A | 2/2000 |
| JP | 2002-176203 A | 6/2002 |
| JP | 2002-252373 | 9/2002 |
| JP | 2003-174200 A | 6/2003 |
| WO | WO-03-107423 | 12/2003 |

* cited by examiner

*Primary Examiner*—Samuel A Gebremariam
(74) *Attorney, Agent, or Firm*—Blakely Sokoloff Taylor & Zafman

(57) ABSTRACT

A recess is formed in a land (2) of an LED reflecting plate (1) formed of a metal plate. The recess comprises a flat LED chip mounting portion (7) and a reflecting portion (8) inclined with respect to the LED chip mounting portion (7). The LED reflecting plate (1) is mounted on a printed wiring board (25) such that the land (2) is fitted in a first through hole (18). An LED chip (27) mounted on the LED chip mounting portion (7) is connected to a terminal portion (22) formed on the printed wiring board (25). The printed wiring board (25) is diced along a third through hole (19) to form an LED device (30) as one unit. With this arrangement, heat radiation properties and reflecting efficiency of the LED device (30) can be improved, and the manufacturing cost can be decreased.

7 Claims, 9 Drawing Sheets

LED REFLECTING PLATE AND LED DEVICE

The present patent application is a non-provisional application of International Application No. PCT/JP2005/016407, filed Sep. 7, 2005.

TECHNICAL FIELD

The present invention relates to an LED reflecting plate and LED device and, more particularly, to an LED reflecting plate which improves the reflecting efficiency of an LED chip to be mounted on it, and an LED device using the same.

BACKGROUND ART

In recent years, LED chips having high luminance have been developed. Such LED chips are not only used as an illumination for the ten-key pad of a conventional cellular phone or the like or as spot illumination, but also becoming to be used as illumination for a comparatively wide range, e.g., a reading lamp. Accordingly, the LED chips require higher heat radiation properties.

As the first example of a conventional LED device, one described in reference 1 (Japanese Patent Laid-Open No. 7-235696) is available. In this LED device, a through hole is formed in an insulating substrate. One opening of the through hole is covered with a metal plate. A metal film is formed on the wall surface of the through hole, the surface of the metal plate, and the surface of the insulating substrate by plating. An LED chip is mounted on the metal plate and is electrically connected to the metal film on the insulating film by wire bonding.

As the second example of the conventional LED device, one as shown in FIG. 12 is available in which a lead frame 102 formed of a thin metal plate is subjected to resin molding, and an LED chip 103 is mounted on the lead frame 102. More specifically, a funnel-shaped recess 101 is formed in molded resin 100. The lead frame 102 is buried in the bottom of the recess 101. The LED chip 103 is mounted on the lead frame 102 and connected to a terminal portion 104 of the lead frame 102 through a thin metal wire by wire bonding.

DISCLOSURE OF INVENTION

Problem to be Solved by the Invention

In the first example of the conventional LED devices described above, the metal film on the wall surface of the through hole formed in the insulating substrate is formed by plating. Accordingly, there is a limit to increasing the thickness of the metal film, and the heat radiation properties cannot be improved.

In contrast to this, in the second example, the lead frame 102 improves the heat radiation properties. However, a mold to form the lead frame 102 and a mold to form the resin are required to increase the cost. It is difficult to perform uniform-thick metal plating on the surface of the molded resin 100. Therefore, the reflecting efficiency of light emitted from the LED decreases.

The present invention has been made in view of the conventional problems described above, and has as its object to improve the heat radiation properties of an LED device.

It is another object of the present invention to improve the reflecting efficiency of light emitted from the LED.

It is still another object of the present invention to decrease the manufacturing cost of the LED device.

MEANS OF SOLUTION TO THE PROBLEM

In order to achieve the above object, an LED reflecting plate according to the present invention is characterized by comprising a plurality of lands each comprising a recess where an LED chip is to be mounted, a first bridging portion which connects the plurality of lands in series, a frame having a frame shape to surround the plurality of lands, and a second bridging portion which connects the frame to, of the plurality of lands, lands which are located at two ends, wherein the lands, the first bridging portion, the second bridging portion, and the frame are made of a metal.

An LED device according to the present invention is characterized by comprising an LED chip, an LED reflecting plate made of a metal and having a recess where the LED chip is to be mounted, and a printed wiring board on which the LED reflecting plate is to be mounted, wherein the printed wiring board comprises a first through hole in which the recess of the LED reflecting plate is to be fitted, and a terminal portion to be electrically connected to the LED chip.

EFFECT OF THE INVENTION

According to the present invention, since the LED chip is mounted on the reflecting plate made of a metal plate, the heat radiation properties improve.

Since the reflecting plate is made of the metal plate, the thickness of an underlying plating film formed on the reflecting plate can be made uniform. Thus, the mirror surface effect of a noble metal plating film formed on the underlying plating film, aluminum deposition, or the like can improve the reflecting efficiency.

Only a mold to form the reflecting plate must be prepared. Thus, the cost of the mold can be decreased, and accordingly the manufacturing cost of an LED device can be decreased.

BEST MODE FOR CARRYING OUT THE INVENTION

The embodiments of the present invention will be described with reference to the drawings.

The first embodiment of the present invention will be described with reference to FIGS. 1 to 6.

Figure 1:
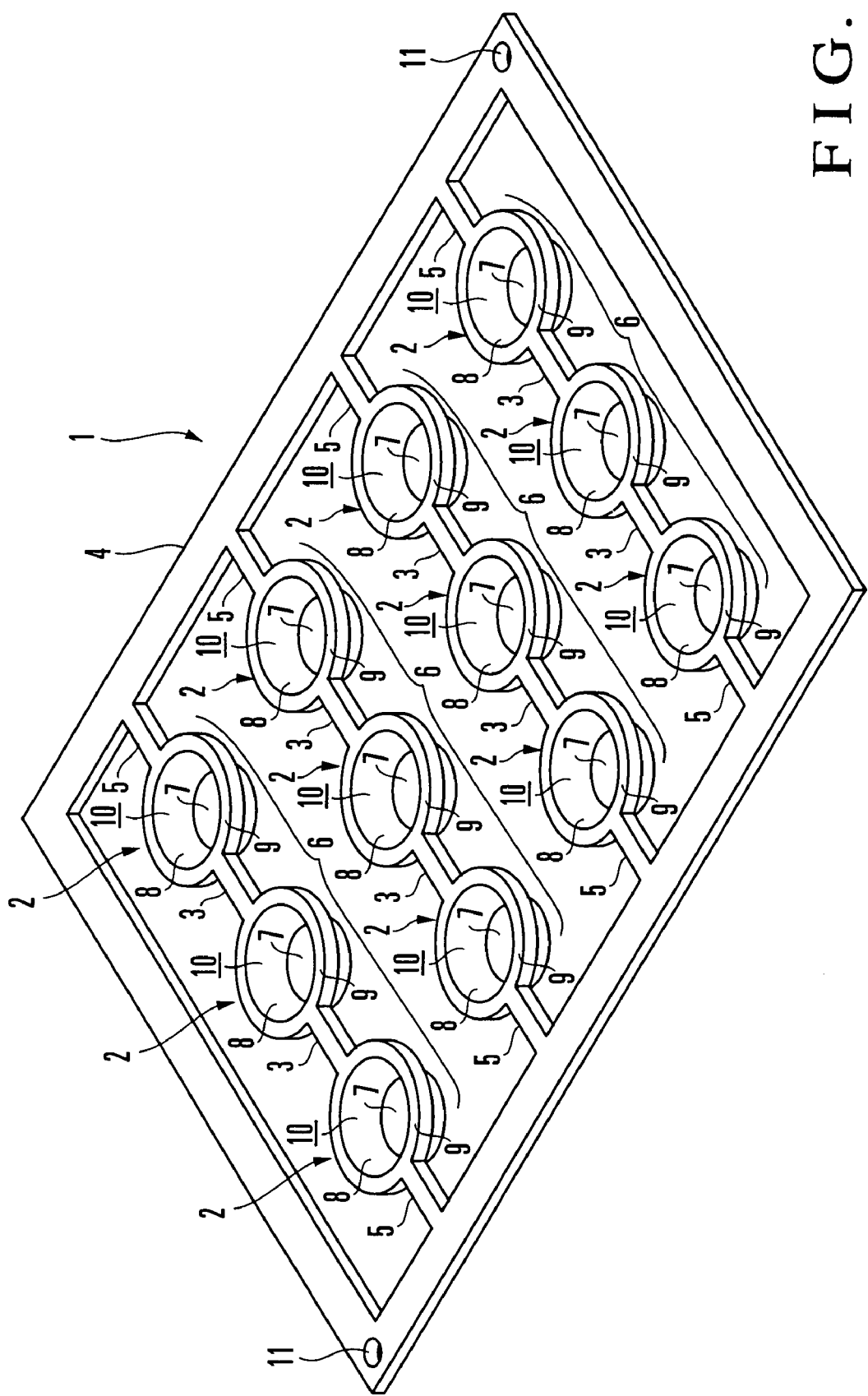
FIG. 1 is a perspective view showing the entire appearance of an LED reflecting plate according to the first embodiment of the present invention.
Figure 2A:
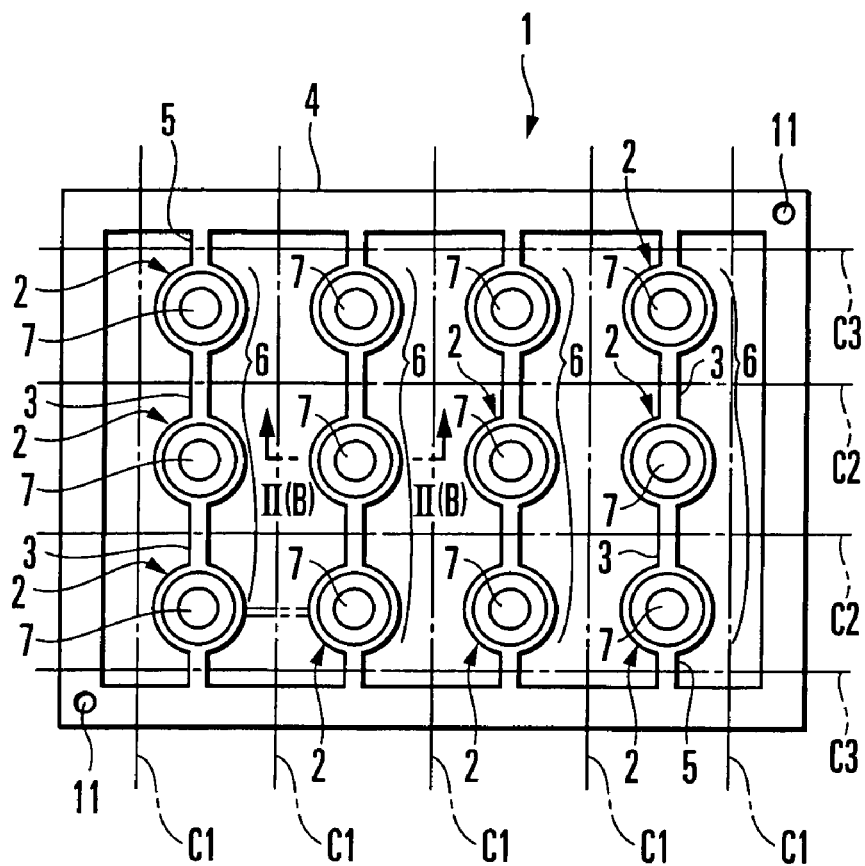
FIG. 2A is a plan view of the LED reflecting plate shown in FIG. 1.

An LED reflecting plate 1 shown in FIGS. 1 and 2A comprises a plurality of lands 2 on which LED chips 27 are to be mounted, first bridging portions 3 which connect the plurality of lands 2 in series, a frame 4 having a frame shape to surround the plurality of lands 2, and second bridging portions 5 which connect, of the plurality of lands 2, the lands at the two ends to the frame 4. The LED reflecting plate 1 is formed from a thin phosphor bronze plate (with a thickness of 50 μm to 200 μm) by punching so that one metal plate forms the lands 2, first bridging portions 3, second bridging portions 5, and frame 4 integrally.

The LED reflecting plate 1 is provided with four land groups 6, each comprising three lands 2 that are linearly connected in series with the first bridging portions 3, to be parallel to each other. The 12 lands 2 are arranged in a matrix of 4 columns×3 rows. Alternatively, a plurality of (to or more) land groups 6 may be provided.

The LED reflecting plate 1 is provided with positioning holes 11, at its two vertices located on a diagonal of the frame 4, to be aligned with a printed wiring board 25 (to be described later).

Figure 2B:
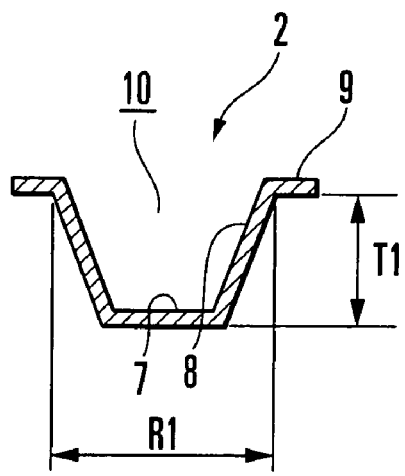
FIG. 2B is a sectional view taken along the line II(B)-II(B) of FIG. 2A.

As shown in FIG. 2B, the land 2 of the LED reflecting plate 1 has a recess formed by drawing and a flat flange 9 around the recess. The recess comprises a flat bottom and a side wall inclined to form an obtuse angle with respect to the bottom. The bottom of the recess forms an LED chip mounting portion 7 where the LED chip 27 is to be mounted, and the side wall of the recess forms a reflecting portion 8 which reflects forward light from an LED. A space 10 surrounded by the LED chip mounting portion 7 and reflecting portion 8 is frustoconical. A height T1 (the height from the lower surface of the flange 9 to the lower surface of the LED chip mounting portion 7) of the space 10 is slightly larger than a thickness T2 of the printed wiring board 25.

To manufacture the LED reflecting plate 1, after punching as described above, drawing is performed. Alternatively, drawing may be performed, and after that punching may be performed, or drawing and punching may be performed simultaneously.

The LED reflecting plate 1 formed in this manner is subjected to nickel plating to form an underlying plating film, and then to silver plating to form a noble metal plating film on the underlying plating film. In this case, since the surface of the land 2 formed of a metal plate is subjected to plating, a nickel plating film serving as the underlying plating film formed on the surface of the land 2 has a uniform thickness entirely. The surface of the silver plating film formed on the nickel plating film accordingly forms a mirror surface having very few steps entirely. Thus, the reflecting efficiency of the surface of the reflecting portion 8 can be improved.

A method of manufacturing the printed wiring board 25 serving as an intermediate member of the LED device according to the present invention will be described with reference to FIGS. 3A to 3F. Although FIGS. 3A to 3F show only one LED device for descriptive convenience, actually, a plurality of LED devices are arranged in a matrix.

Figure 3A:
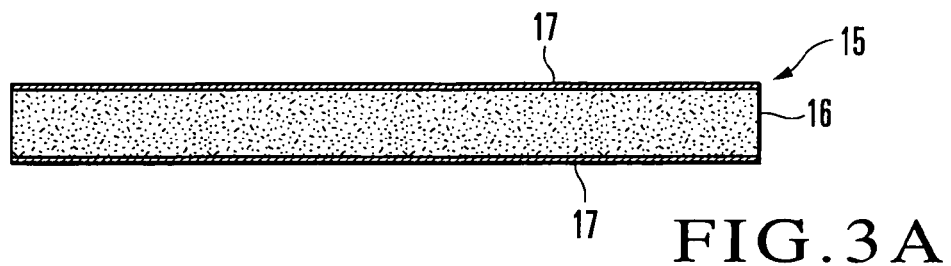
FIGS. 3A to 3F are sectional views to explain a method of manufacturing an LED device according to the first embodiment of the present invention.
Figure 3B:
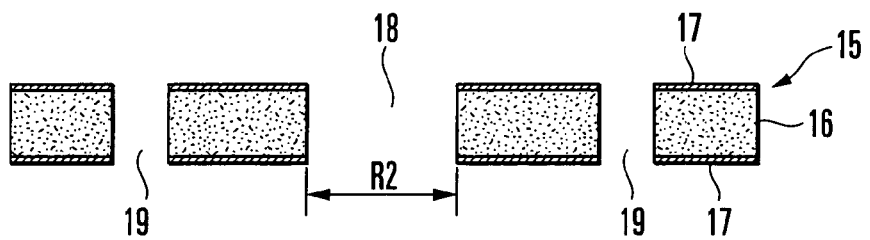

FIG. 3A shows a double-side copper-clad board 15 obtained by adhering copper foils 17 to the two surfaces of an insulating substrate 16. The double-side copper-clad board 15 is subjected to boring with a drill to form a first through hole 18 and third through holes 19 which intervene between the first through hole 18, as shown in FIG. 3B. A diameter R2 of the first through hole 18 is slightly larger than an outer diameter (an outer diameter added with the thickness of the land 2) R1 at the upper end of the space 10 formed above the land 2 of the reflecting plate 1 (described above).

Figure 3C:
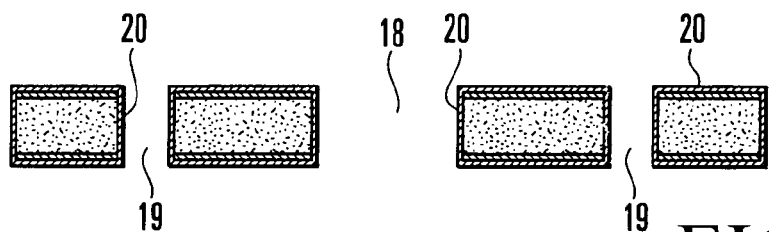
Figure 3D:
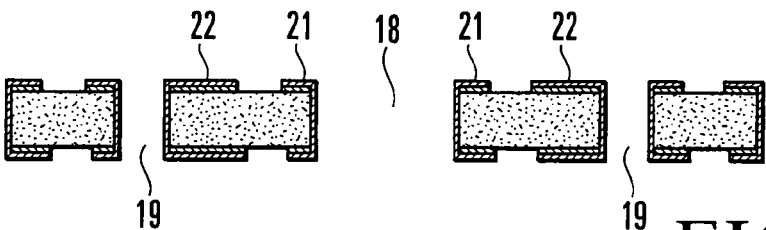

Subsequently, the double-side copper-clad board 15 is subjected to panel plating by electrolytic copper plating to form a plating film 20 to cover the two surfaces of the insulating substrate 16 and the hole walls of the first and second through holes 18 and 19, as shown in FIG. 3C. Furthermore, a circuit is formed by etching, as shown in FIG. 3D, to form a land placing portion 21, where the land 2 described above is to be placed, at the upper edge of the first through hole 18. Terminal portions 22 for wire bonding are formed at portions away from the land placing portion 21.

Figure 3E:
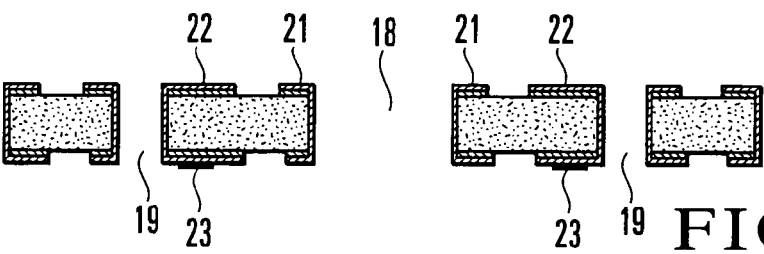
Figure 3F:
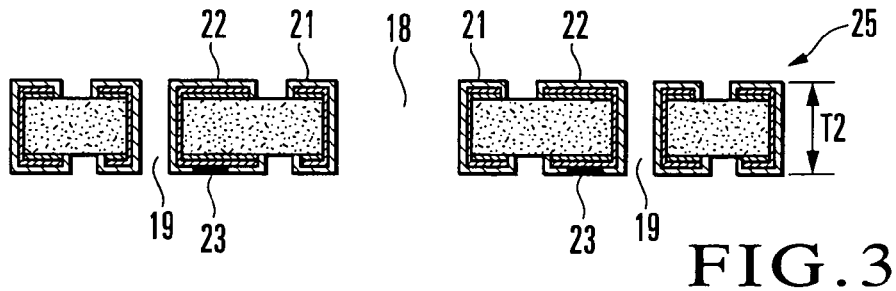

In FIG. 3E, a solder resist 23 is applied to an unnecessary circuit. Then, as shown in FIG. 3F, the land placing portion 21 and terminal portions 22 are subjected to noble metal plating using nickel and gold to form the printed wiring board 25.

A method of manufacturing the LED device using the printed wiring board 25 formed in this manner and the LED reflecting plate 1 described above will be described with reference to FIGS. 4A to 4D.

Figure 4A:
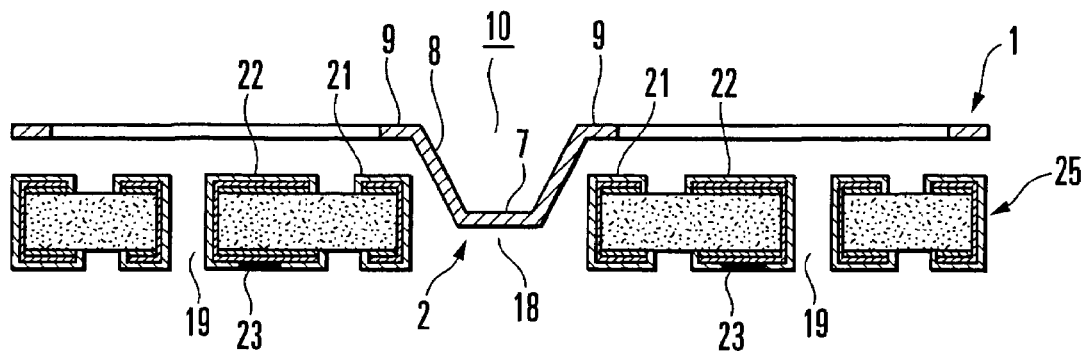
FIGS. 4A to 4D are sectional views to explain the method of manufacturing the LED device according to the first embodiment of the present invention.
Figure 4B:
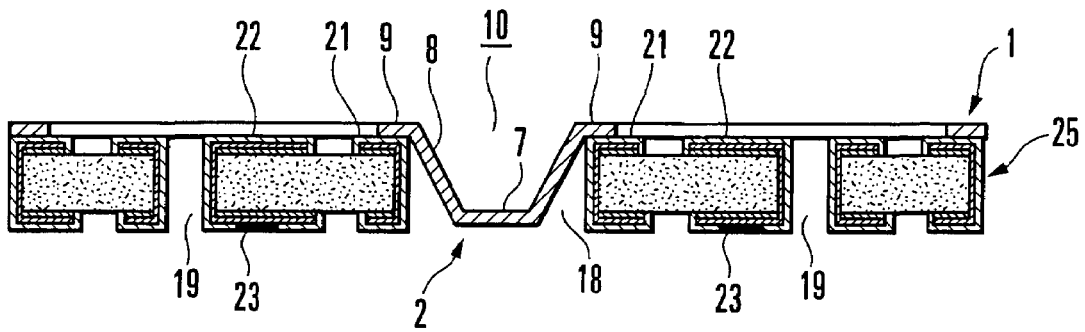

Referring to FIG. 4A, a cream solder is applied to the land placing portion 21 of the printed wiring board 25. After that, positioning pins (neither is shown) are inserted in the positioning holes 11 of the printed wiring board 25 and the positioning holes of the printed wiring board 25 to place the LED reflecting plate 1 on the printed wiring board 25 such that the lands 2 of the LED reflecting plate 1 are respectively fitted in the plurality of first through holes 18 of the printed wiring board 25. In this state, the printed wiring board 25 and LED reflecting plate 1 are heated in a heating furnace to fuse the cream solder again, so that the flange 9 of each land 2 is bonded on the land placing portion 21 of the printed wiring board 25 and that the LED reflecting plate 1 is bonded on the printed wiring board 25, as shown in FIG. 4B.

Figure 4C:
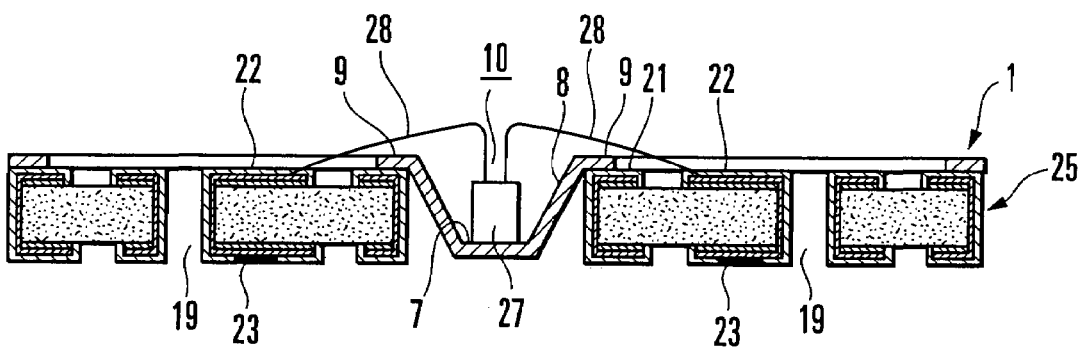
Figure 4D:
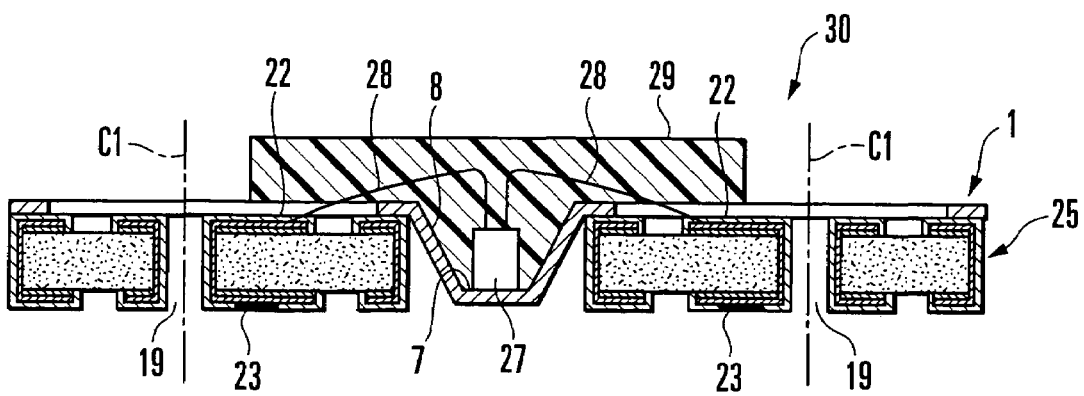
Figure 5A:
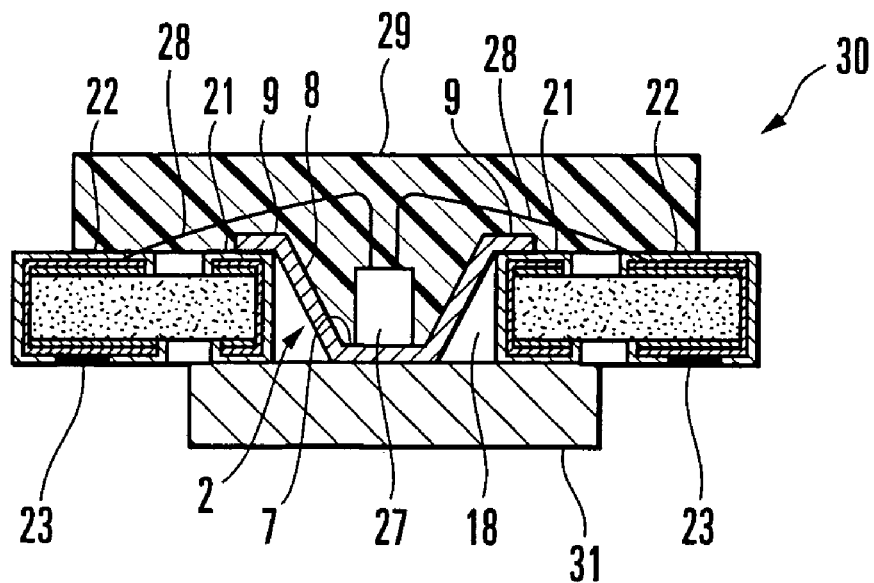
FIG. 5A is a sectional view of the LED device according to the first embodiment of the present invention.
Figure 5B:
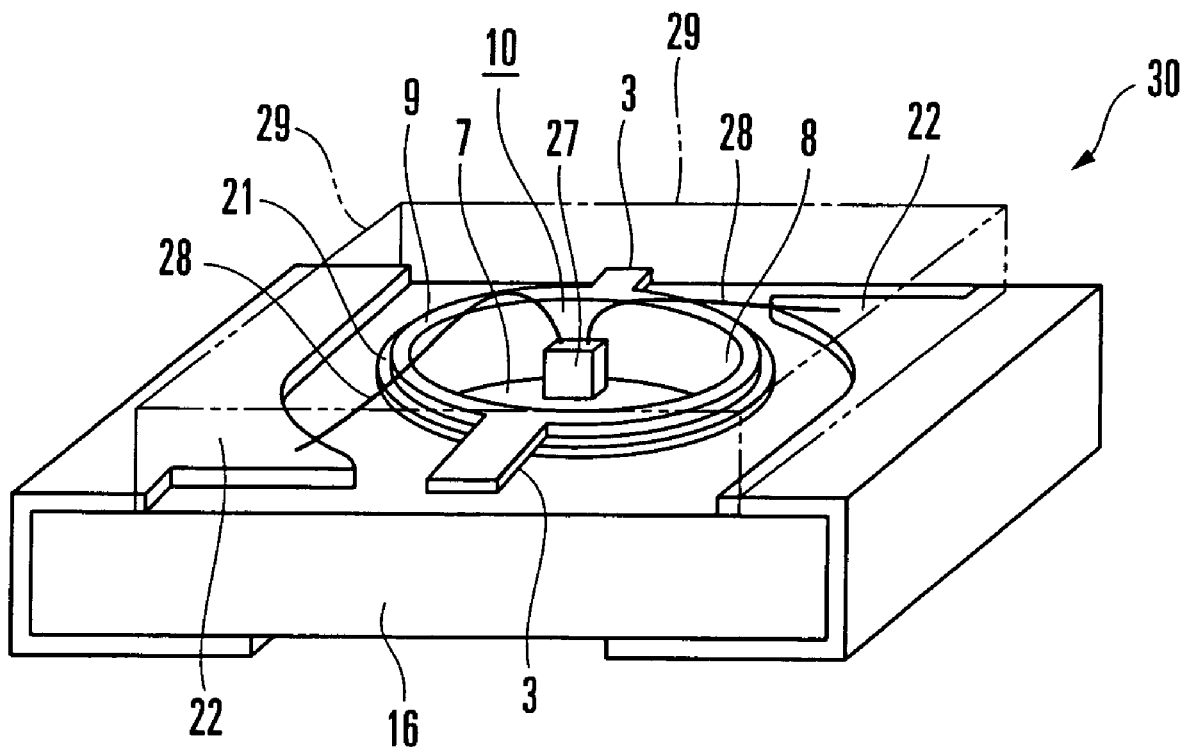
FIG. 5B is a perspective view showing the appearance of the LED device shown in FIG. 5A.

Subsequently, as shown in FIG. 4C, the LED chip 27 is bonded on the LED chip mounting portion 7 of the LED reflecting plate 1 by die bonding, and thin metal wires (wires) 28 of the LED chip 27 are electrically connected to the terminal portions 22 of the printed wiring board 25 by wire bonding. As shown in FIG. 4D, the land 2 of the LED reflecting plate 1 and the terminal portions 22 of the printed wiring board 25 are resin-sealed with a transparent molding resin 29. As shown in FIG. 2A, lines C1 which are parallel to the first and second bridging portions 3 and 5 and connect the third through holes 19, lines C2 which are perpendicular to the lines C1 and cross the first bridging portions 3, and lines C3 which cross the second bridging portions 5 are cut by dicing. Thus, LED devices 30 each forming one unit as shown in FIGS. 5A and 5B are formed.

A heat sink 31 serving as a cooling member which cools the land 2 of the LED reflecting plate 1 is attached to the bottom of the LED device 30. As the height T1 of the space 10 of the land 2 is slightly larger than the thickness T2 of the printed wiring board 25, the bottom of the recess of the land 2 comes into contact with the heat sink 31. Thus, heat generated by the LED chip 27 is dissipated from the land 2 outside the LED device 30 through the heat sink 31. At this time, as the land 2 on which the LED chip 27 is mounted is formed of the metal plate, the land 2 can be formed to have a predetermined thickness or more and uniformly, to improve heat radiation properties.

In this embodiment, one plating process by masking the printed wiring board 25 suffices. Therefore, when compared to a conventional example that requires plating twice by masking in order to form a reflecting portion and the remaining portions with different plating films, the manufacturing cost can be decreased. Since only a mold to form the LED reflecting plate 1 must be prepared, the cost required by the mold can be decreased.

In the LED device 30 described above, cutting at the lines C1, C2, and C3 forms the LED device 30 as one unit. When a plurality of LED chips 27 are to be used as an aggregation as in a display device or illumination device, the printed wiring board 25 need not be cut, but may be used with the plurality of LED reflecting plates 1 being mounted on it.

Figure 6:
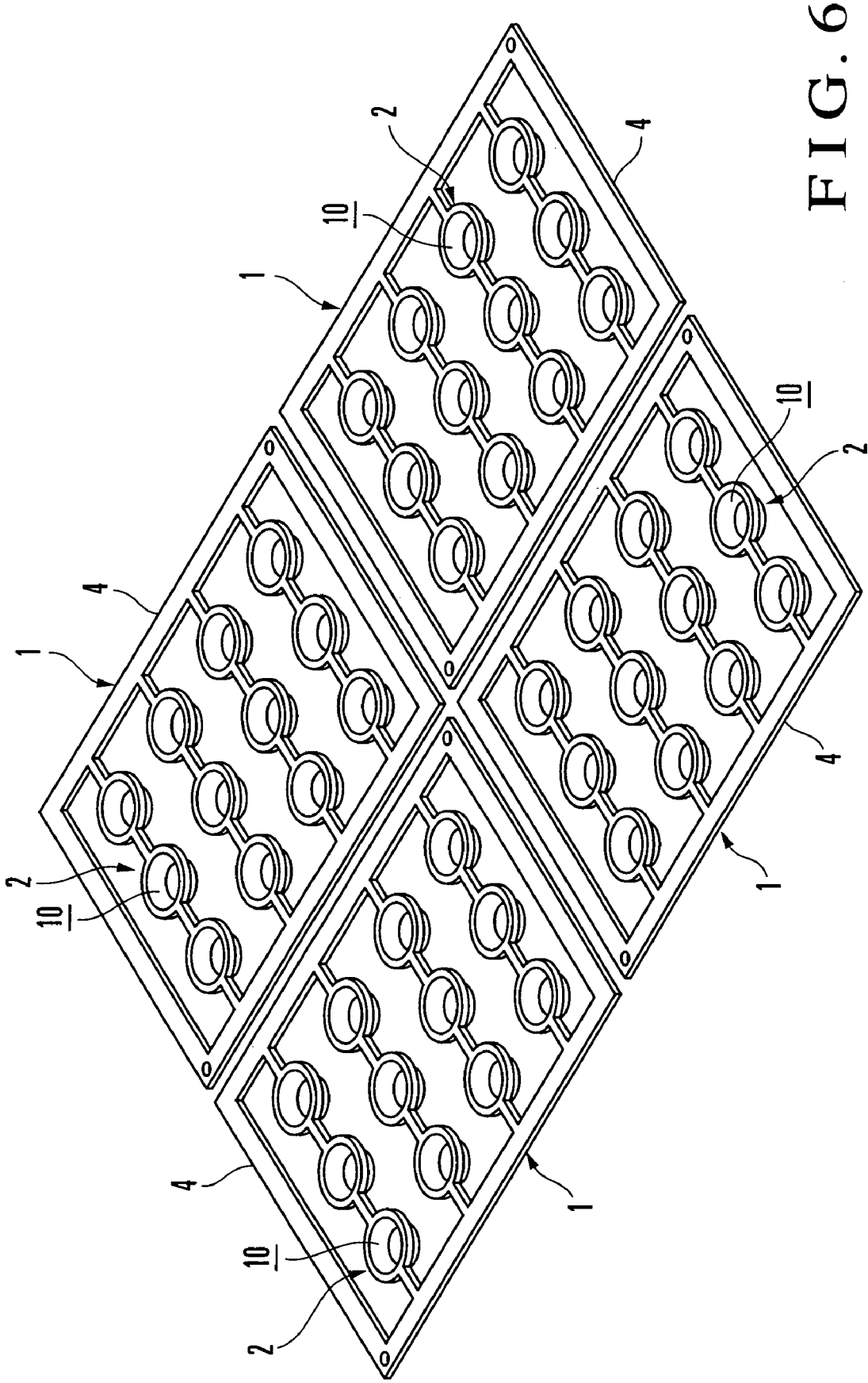
FIG. 6 is a perspective view showing the array of LED reflecting plates to cope with a case wherein a printed wiring board is formed to be larger than an LED reflecting plate.

A case will be described with reference to FIG. 6 wherein the printed wiring board 25 is formed to be larger than the LED reflecting plate 1. As the LED reflecting plate 1 is formed of a very thin metal plate, from the viewpoint of the strength, there is a limit to forming the LED reflecting plate 1 to have a large outer size. For this reason, the printed wiring board 25 may be formed to have a larger outer size than that of the LED reflecting plate 1. In this case, if a plurality of LED reflecting plates 1 are arrayed in a matrix, the outer size of the plurality of LED reflecting plates 1 as a whole can be set to coincide with the outer size of the large printed wiring board 25.

In this case, LED devices 30 each serving as one unit may be formed by cutting. Alternatively, the printed wiring board 25 need not be cut, but may be used with the plurality of LED reflecting plates 1 being mounted on it. In the latter case, an LED device which is suitably employed in a display device, illumination device, or the like which requires high luminance can be provided. The array of the LED reflecting plates 1 is not limited to the matrix described above to match the outer shape of the printed wiring board 25, but may be a horizontal array or vertical array.

The second embodiment of the present invention will be described with reference to FIG. 7.

Figure 7:
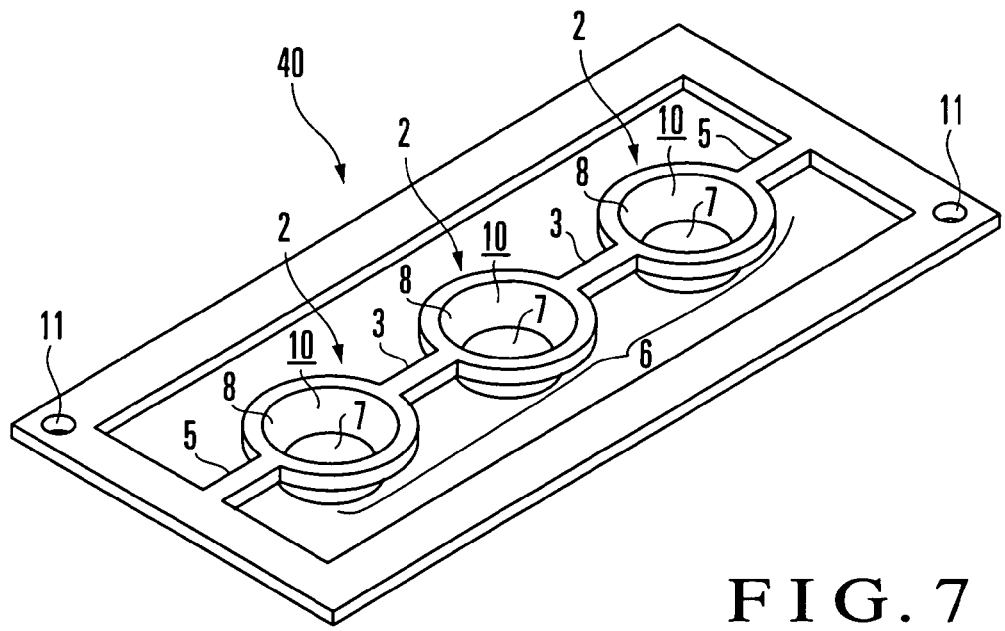
FIG. 7 is a perspective view showing an LED reflecting plate according to the second embodiment of the present invention.

An LED reflecting plate 40 shown in FIG. 7 is different from the first embodiment described above in that a land group 6 comprising three lands 2 which are linearly connected in series through first bridging portions 3 comprises only one group. With this arrangement, the array of first through holes 18 formed in a printed wiring board 25 can also cope with arrays other than 4 arrays or 4×n (n is an integer) arrays, unlike the first embodiment described above.

The third embodiment of the present invention will be described with reference to FIG. 8.

Figure 8:
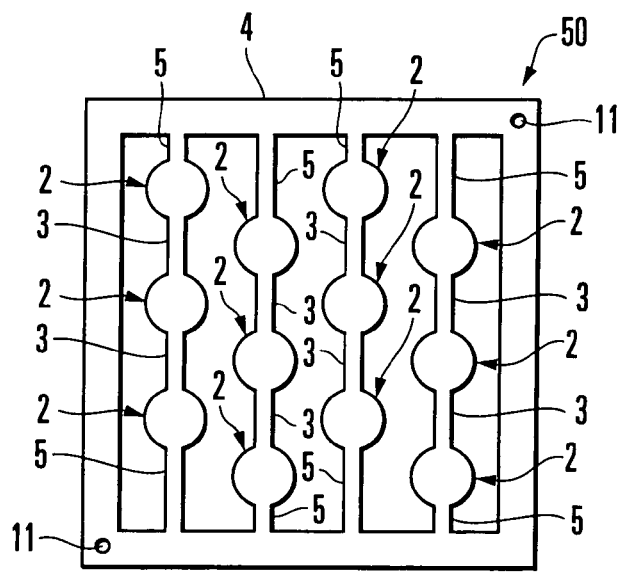
FIG. 8 is a plan view showing the arrangement of lands in an LED reflecting plate according to the third embodiment of the present invention.

An LED reflecting plate 50 shown in FIG. 8 is characterized in that lands 2 are not formed in a matrix but are in a staggered manner. With this arrangement, the density of the lands 2 can be increased. Therefore, an LED device which is suitably employed in a display device, illumination device, or the like which requires high luminance and uses LED devices as an aggregate can be provided.

The fourth embodiment of the present invention will be described with reference to FIG. 9.

Figure 9:
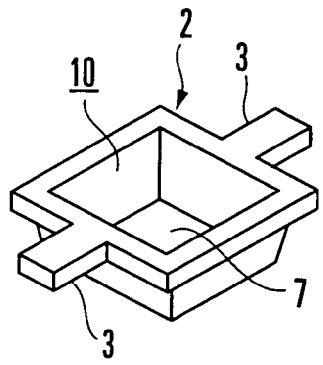
FIG. 9 is a perspective view showing a land in an LED reflecting plate according to the fourth embodiment of the present invention.

This embodiment is characteristic in that an LED chip mounting portion 7 of a land 2 is square and that a space 10 is frustopyramidal, as shown in FIG. 9. In this arrangement, an LED chip having a square section is mounted on the LED chip mounting portion 7 of the land 2, so that the LED chip mounting portion 7 can be formed relatively small.

Although the first bridging portions 3 and second bridging portions 5 are arranged on one straight line in the embodiments descried above, they need not always be arranged on one straight line. It suffices as far as the lands 2, and the lands 2 and frame 4 are connected integrally.

The fifth embodiment of the present invention will be described with reference to FIGS. 10A and 10B.

Figure 10A:
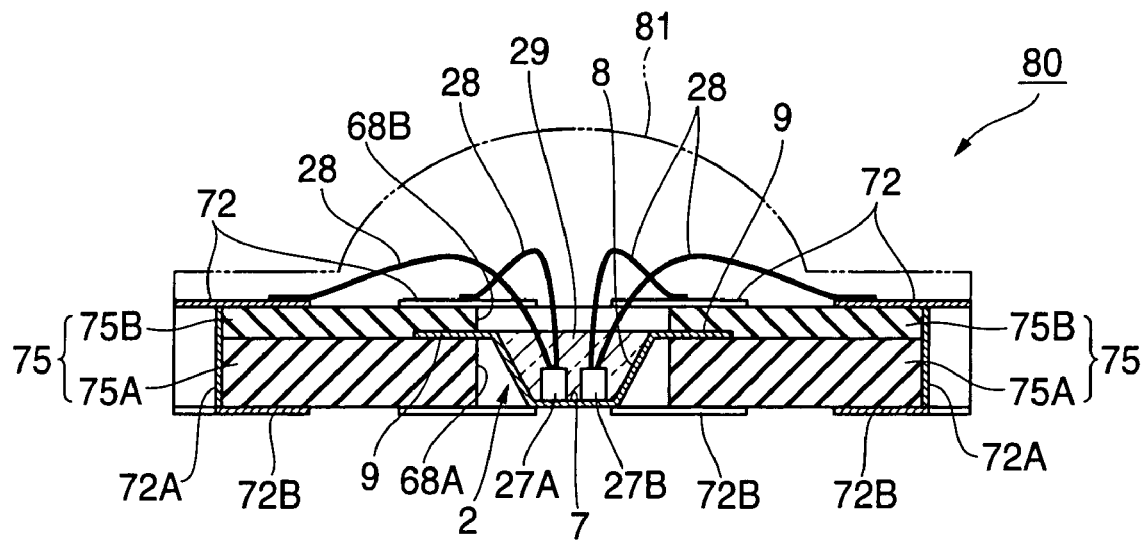
FIG. 10A is a sectional view of an LED device according to the fifth embodiment of the present invention.
Figure 10B:
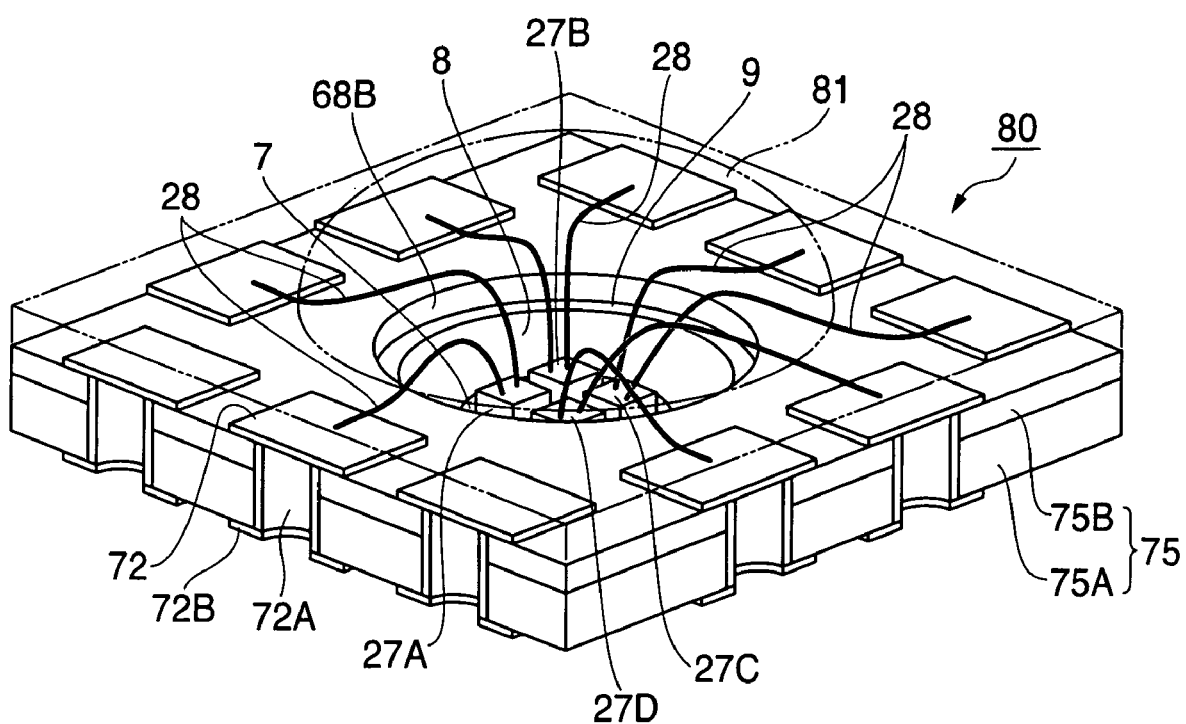
FIG. 10B is a perspective view showing the outer appearance of the LED device shown in FIG. 10A.

An LED device 80 shown in FIGS. 10A and 10B is characterized in that a plurality of LED chips 27A to 27D are mounted in the recess of each land 2 of an LED reflecting plate and that the land 2 is arranged in a printed wiring board 75 and integrated with it. This arrangement will be described in more detail.

The printed wiring board 75 has a lower-layer substrate 75A serving as the first substrate and an upper-layer substrate 75B serving as the second substrate. Both the lower-layer substrate 75A and upper-layer substrate 75B are formed of insulating substrates. A first through hole 68A to fit with the recess of the land 2 is formed in the lower-layer substrate 75A. A second through hole 68B from which thin metal wires 28 to be connected to the LED chips 27A to 27D on the land 2 are extended is formed in the upper-layer substrate 75B. The first through hole 68A and second through hole 68B have the same shape and the same size to form one through hole.

With the recess of the land 2 being fitted in the first through hole 68A, the upper surface of the lower-layer substrate 75A is bonded to the lower surface of the upper-layer substrate 75B. This forms a structure in which the land 2 is incorporated in the printed wiring board 75.

On the upper surface of the upper-layer substrate 75B, a plurality of terminal portions 72 are formed around the second through hole 68B. Two terminal portions 72 correspond to each one of the LED chips 27A to 27D to be mounted on the land 2. Of the two terminal portions 72, one is a positive terminal and the other is a negative terminal. Two thin metal wires 28 are connected to each one of the LED chips 27A to 27D. The thin metal wires 28 are extended from the second through hole 68B. Of the two thin metal wires 28, one is electrically connected to the positive terminal portion 72, and the other is connected to the negative terminal portion 72.

Side-surface terminal portions 72A are formed on the side surfaces of the upper-layer substrate 75B and lower-layer substrate 75A that are bonded to each other. Lower-surface terminal portions 72B are formed on the lower surface of the lower-layer substrate 75A. The terminal portions 72A and 72B are electrically connected to the terminal portions 72. The terminal portions 72 and lower-surface terminal portions 72B are formed by etching copper foils adhered to the upper and lower surfaces of the upper- and lower-layer substrates 75B and 75A, respectively. The side-surface terminal portions 72A are formed of plating films in the third through holes that extend through the substrates 75A and 75B. The plurality of third through holes are formed, around the first and second through holes 68A and 68B, along the lines C1, C2, and C3 shown in FIG. 2A.

A space 10 surrounded by an LED chip mounting portion 7 and reflecting portion 8 of the land 2 is resin-molded with a transparent molding resin 29. A dome-like lens 81 is arranged on the upper-layer substrate 75B.

To form the LED device 80 which forms one unit as shown in FIGS. 10A and 10B, a plurality of LED devices arranged in a matrix may be cut along the lines C1, C2, and C3 shown in FIG. 2A, in the same manner as in the first embodiment. When LED devices are to be used as an aggregate, they need not be cut.

According to this embodiment, to bond the lower-layer substrate 75A to the upper-layer substrate 75B, a material to form the lower-layer substrate 75A and a material for the upper-layer substrate 75B may be adhered, heated, and hardened. At this time, as the recess of the land 2 is fitted in the first through hole 68A, the upper surface of the lower-layer substrate 75A and the lower surface of the upper-layer substrate 75B sandwich a flange 9 of the land 2. Therefore, according to this embodiment, bonding with an adhesive or by welding is not necessary to bond the land 2 to the printed wiring board 75.

Each terminal portion 72 on the printed wiring board 75 has a thickness of about several ten μm, whereas the flange 9 has a thickness of about several hundred μm. If the land 2 appears on the surface of the printed wiring board 25, as in the first embodiment, the entire LED device 30 becomes thicker by an amount corresponding to the thickness of the flange 9. In contrast to this, according to this embodiment, since the land 2 is arranged in the printed wiring board 75 and does not appear on the surface of the printed wiring board 75, the LED device 80 can be made thinner than in the first embodiment.

If the flange 9 of the land 2 and the terminal portions 22 are arranged on the surface of one printed wiring board 25, as in the first embodiment, the flange 9 of the land 2 and the terminal portions 22 must be set apart by a sufficient distance between them so they will not come into contact with each other. In contrast to this, according to this embodiment, the flange 9 of the land 2 and the terminal portions 22 are arranged on the different layers of the printed wiring board 75. Thus, the area of the LED device 80 can be decreased when compared to the first embodiment.

In the LED device 90 described above, the plurality of LED chips 27A to 27D are mounted on one land 2. Alternatively, one LED chip may be mounted on one land 2.

The sixth embodiment of the present invention will be described with reference to FIG. 11.

Figure 11:
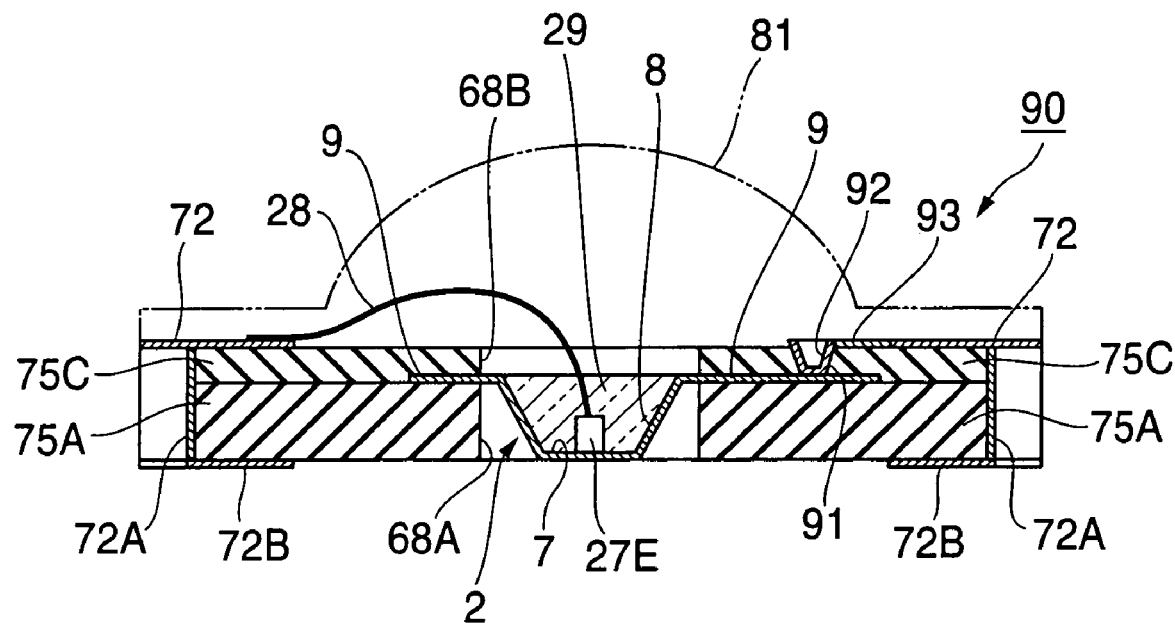
FIG. 11 is a sectional view of an LED device according to the sixth embodiment of the present invention.
Figure 12:
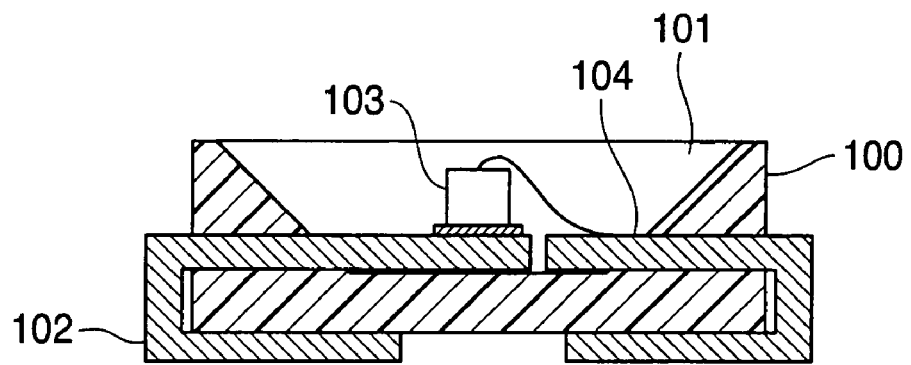
FIG. 12 is a sectional view of a conventional LED device.

An LED device 90 shown in FIG. 11 is characterized in that power is supplied to an LED chip 27E mounted on a land 2 via one thin metal wire 28 and the land 2 made of a metal. The LED chip 27E is connected to terminal portions 72 on an upper-layer substrate 75C through the thin metal wires 28. This arrangement is the same as that of the fifth embodiment described above.

In the LED device 90, an electrical connection hole 91 is formed in that portion of the land 2 of the upper-layer substrate 75C which is above a flange 9. A plating film 92 is formed on the hole wall of the electrical connection hole 91. An interconnection 93 which extends from the electrical connection hole 91 to the corresponding terminal portion 72 is formed on the upper surface of the upper-layer substrate 75C. Thus, the LED chip 27E is electrically connected to the terminal portion 72 through the metal land 2, plating film 92 in the electrical connection hole 91, and the interconnection 93 on the upper-layer substrate 75C.

For example, the electrical connection hole 91 and plating film 92 can be formed in the following manner. First, a lower-layer substrate 75A is bonded to an upper-layer substrate 75C, and the electrical connection hole 91 is formed by boring with a drill or a laser. After that, panel plating with electrolytic copper plating is performed to form the plating film 92 on the hole wall of the electrical connection hole 91.

In this embodiment, a plurality of LED chips may be mounted on one land 2, in the same manner as in the fifth embodiment.

The invention claimed is:

1. An LED device comprising:
   an LED chip;
   an LED reflecting plate made of a metal and having a recess where said LED chip is to be mounted; and
   a printed wiring board on which said LED reflecting plate is to be mounted,
   wherein said printed wiring board comprises:
   a first through hole in which the recess of said LED reflecting plate is to be fitted, said first through hole being formed as a circular cylindrical hole which is substantially straight and vertical to said printed wiring board:
   a plating film formed so as to cover continuously the entire surfaces of upper and bottom peripheral edges and a circumferential wall of said first through hole, wherein the plating film is separate from the LED reflecting plate; and
   a terminal portion formed on a surface of said printed wiring board to be electrically connected to said LED chip, and
   wherein said LED reflecting plate further comprises:
   a flat LED chip mounting portion which forms a bottom of the recess, and
   a reflecting portion which forms a side wall of the recess and is inclined with respect to said LED chip mounting portion; and
   a flange, formed on and along the entire circumference of an upper peripheral edge of the recess, to be bonded onto said plating film at a position thereof along and corresponding to the upper peripheral edge of said first through hole of said printed wiring board.

2. An LED device according to claim 1, characterized in that a space surrounded by said bottom and side wall of the recess of said LED reflecting plate is formed into one of a frustoconical shape and a frustopyramidal shape.

3. An LED device according to claim 1, characterized in that said LED reflecting plate comprises
   a plurality of lands each comprising the recess, and
   a first bridging portion which connects said plurality of lands in series.

4. An LED device according to claim 1, characterized by further comprising a thin metal wire which electrically connects said LED chip and said terminal portion,
   said LED reflecting plate further comprising
   a flat flange around the recess, and
   said printed wiring board further comprising
   a first substrate formed with the first through hole,
   a second substrate which sandwiches, together with said first substrate, said flange of said LED reflecting plate the recess of which is fitted in the first through hole, and
   a second through hole which is formed in said second substrate and through which said thin metal wire connected to said LED chip on said LED reflecting plate is extended.

5. An LED device according to claim 1, characterized in that a plurality of LED chips are mounted on each recess of said LED reflecting plate.

6. An LED device according to claim 4, characterized in that said printed wiring board further comprises
   an electrical connection hole formed in a portion of said second substrate which is above said flange, and
   a wiring line which is formed on a surface of said second substrate and electrically connects the electrical connection hole to said terminal portion.

7. An LED device according to claim 1 further comprising a cooling member which is in contact with a bottom of the recess of said LED reflecting plate and with said plating film at a position thereof corresponding to the bottom of said first through hole.

* * * * *